US009959610B2

(12) United States Patent
Tertitski et al.

(10) Patent No.: US 9,959,610 B2
(45) Date of Patent: May 1, 2018

(54) SYSTEM AND METHOD TO DETECT SUBSTRATE AND/OR SUBSTRATE SUPPORT MISALIGNMENT USING IMAGING

(71) Applicant: Applied Materials, Inc., Santa Clara, CA (US)

(72) Inventors: Leonid M. Tertitski, Los Gatos, CA (US); Schubert S. Chu, San Francisco, CA (US); Shay Assaf, Gilroy, CA (US); Kim R. Vellore, San Jose, CA (US); Zhepeng Cong, Vancouver, WA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 59 days.

(21) Appl. No.: 14/882,122

(22) Filed: Oct. 13, 2015

(65) Prior Publication Data

US 2016/0125589 A1    May 5, 2016

Related U.S. Application Data

(60) Provisional application No. 62/072,488, filed on Oct. 30, 2014.

(51) Int. Cl.
*G06T 7/00* (2017.01)
(52) U.S. Cl.
CPC .. *G06T 7/0004* (2013.01); *G06T 2207/10024* (2013.01); *G06T 2207/30148* (2013.01)
(58) Field of Classification Search
CPC ............... G06T 17/10072; G06T 17/00; G06T 2200/24; H04N 5/2258

USPC ....... 382/151, 170, 260, 275, 279, 291, 294, 382/295; 358/537, 452, 463
See application file for complete search history.

(56) References Cited

U.S. PATENT DOCUMENTS

| 5,783,833 | A | 7/1998 | Sugaya et al. |
| 5,943,135 | A | 8/1999 | Mishima |
| 7,019,836 | B2 | 3/2006 | Mishima |
| 7,728,845 | B2 * | 6/2010 | Holub ................. G01J 3/02 345/589 |
| 8,023,016 | B2 * | 9/2011 | Iijima ................. H04N 3/1593 348/262 |
| 8,059,145 | B2 * | 11/2011 | Ueda .................. G03G 15/01 347/116 |

(Continued)

FOREIGN PATENT DOCUMENTS

EP    0358425 A2    3/1990

*Primary Examiner* — Yosef Kassa
(74) *Attorney, Agent, or Firm* — Patterson + Sheridan LLP

(57) ABSTRACT

A method and apparatus for detecting substrate misalignment (i.e., position displacement error) and/or substrate support misalignment. According to certain aspects, a method for detecting a misalignment of an object in a processing system is provided. The method generally includes obtaining a first image of the object, determining first values associated with pixels in at least one region of the first image, calculating at least one of a center of gravity value of the pixels in the at least one region or an average weight of the pixels in the at least one region, and detecting a misalignment of the object based on at least one of the calculated center of gravity or average weight of the pixels in the at least one region.

16 Claims, 7 Drawing Sheets

(56) References Cited

U.S. PATENT DOCUMENTS

| | | | | |
|---|---|---|---|---|
| 8,081,844 B2* | 12/2011 | Steinberg | ........... | G06K 9/00228 |
| | | | | 382/228 |
| 8,213,737 B2* | 7/2012 | Steinberg | ........... | G06K 9/00248 |
| | | | | 382/254 |
| 8,294,827 B2* | 10/2012 | Kao | ......... | H04N 9/73 |
| | | | | 348/655 |
| 8,358,818 B2* | 1/2013 | Miga | ...... | A61B 90/36 |
| | | | | 382/128 |
| 8,391,645 B2* | 3/2013 | Steinberg | ........... | G06K 9/00228 |
| | | | | 348/169 |
| 8,452,121 B2* | 5/2013 | Kanai | .......... | H04N 5/205 |
| | | | | 345/589 |
| 8,466,422 B2* | 6/2013 | Johnson | .......... | G01C 3/08 |
| | | | | 250/332 |
| 8,503,463 B2* | 8/2013 | Desai | ................ | H04L 12/4625 |
| | | | | 370/389 |
| 8,520,969 B2* | 8/2013 | Tomaselli | ................ | H04N 1/58 |
| | | | | 348/650 |
| 8,543,020 B2* | 9/2013 | Miyadera | ............ | G03G 15/161 |
| | | | | 399/301 |
| 8,553,037 B2* | 10/2013 | Smith | .................... | G06T 13/40 |
| | | | | 345/473 |
| 8,682,097 B2* | 3/2014 | Steinberg | ................ | G06T 5/50 |
| | | | | 382/275 |
| 2004/0057600 A1* | 3/2004 | Niwa | .................. | B60R 25/104 |
| | | | | 382/103 |

* cited by examiner

SYSTEM AND METHOD TO DETECT SUBSTRATE AND/OR SUBSTRATE SUPPORT MISALIGNMENT USING IMAGING

CROSS-REFERENCE TO RELATED APPLICATIONS

This application claims priority to U.S. provisional patent application Ser. No. 62/072,488, filed Oct. 30, 2014, which is herein incorporated by reference.

BACKGROUND

Field

The present disclosure relates to semiconductor manufacturing and processing. More particularly, the disclosure relates to a process and apparatus for detecting substrate misalignment (i.e., position displacement error) and/or substrate support (e.g., susceptor) misalignment.

Description of the Related Art

In a semiconductor device fabrication process, such as CVD, epitaxy, or other thermal processing, substrates are often processed within chambers or other processing apparatuses. In order to process a substrate within the chamber, the substrate may be firmly attached to a substrate support within the chamber during processing to mitigate movement of the substrate. If the substrate support degrades over time, the substrate may no longer be firmly adhered to the substrate support, causing the substrate to move (which may cause substrate misalignment). Additionally, the substrate support may not rotate evenly and become misaligned. Numerous other factors may also lead to the substrate becoming misaligned. If the substrate becomes misaligned, uniformity in thickness and/or film properties may be adversely impacted.

Some semiconductor device fabrication processing systems may transfer a substrate between multiple chambers each having substrate support structures, for example, a deposition apparatus, an etching apparatus, an inspection apparatus, and the like. Such substrate exchange handling can result in significant slippage due to improper alignment. The substrate can be transferred between chambers by a transfer arm having a fork or an end effector. When the substrate support structures within a processing system are improperly aligned, the support structures do not hold the substrates at about the same inclination, or tilt. Thus, when one support structure transfers a substrate to another support structure, such as when the lift pins remove a substrate from a blade of the transfer chamber substrate handler or place a substrate onto the substrate support in a process chamber, one point of the substrate will always touch the receiving support structure before other points do. If substantial motion occurs prior to the remaining points making contact, then the substrate can slip. In this manner, potentially contaminating particles may be scraped from the contacting points of the substrate causing backside contamination of the substrate. These particles may eventually work their way around to the top of the substrate and be deposited on the processed surface of the substrate, thereby contaminating the micro circuits or other structures constructed thereon. Additionally, when the substrate does not touch a receiving support structure with all points in very close alignment, then the substrate may be shifted from its proper, or expected, position, so that the substrate is off-center. As mentioned above, an off-center substrate may undergo uneven or otherwise improper processing or may come in contact with surfaces or objects within the processing system that will contaminate the substrate, create potentially contaminating airborne particles or even break the substrate.

The need for placement accuracy is illustrated in prior art FIG. 1. A typical substrate 10 and a substrate support, e.g., a susceptor 12 for holding the substrate 10 within a single-substrate processing chamber, are depicted therein. For a given substrate 10, the pocket on a susceptor 12 which receives the substrate 10 generally has a diameter only slightly larger than that of the substrate 10. There is often a very small clearance 14 between the edge of the substrate 10 and the edge of the susceptor 12 pocket. The substrate 10 is centered in the pocket and a gap is maintained between the edge of the substrate 10 and the sidewalls of the pocket. If the substrate 10 has contact with the sidewalls of the pocket, local temperature changes occur, resulting in temperature gradients across the substrate 10. This can cause non-uniformity in process results, as most semiconductor processing depends critically on temperature. Similarly, uncentered substrates can be damaged during placement in a number of different handling situations.

During semiconductor processing, particularly during thermal processing, a substrate being supported by a traditional substrate support may warp, bow, and even break due to the thermal gradient caused by rapid thermal heating. In some cases, the deformation of the substrate may lead to thermal non-uniformity across the substrate because deformation causes different areas of the substrate to have different exposure to the heat sources. In high temperature deposition processes, different materials may shrink at different rates due to having different properties. This may cause a stack to stress and bow, producing a warped shaped. Also, the substrate may bow or warp due to thermal forces in the chamber. Moreover, layers may undergo stress changes when exposed to high temperatures, which can also lead to warping. Substrate bow and warping may have undesirable effects, such as limiting the number of layers that can be stacked.

One approach for determining position of a substrate, edge ring, and/or susceptor involves imaging. A device capable of imaging, such as a camera, can be used to detect position. Conventional imaging techniques for determining substrate, edge ring, and/or susceptor position use edge detection. Edge detection is a technique for identifying points in a digital image at which the image brightness changes sharply or, more formally, has discontinuities. The points at which image brightness changes sharply are typically organized into a set of curved line segments referred to as "edges". Edge detection is a fundamental tool in image processing, machine vision and computer vision, particularly in the areas of feature detection and feature extraction. However, low image brightness or contrast can lead to unacceptable error in edge detection using conventional techniques.

Therefore, a need exists for an apparatus and method for determining the position of substrates and/or various substrate handling mechanisms of a processing system.

SUMMARY

Implementations of the present disclosure generally relate to methods and apparatuses for manufacturing (e.g., fabrication) and processing semiconductor devices. In one implementation, a method for detecting a misalignment of an object in a processing system is provided. The method includes obtaining a first image of the object, determining first values associated with pixels in at least one region of the first image, calculating at least one of: a center of gravity value of the pixels in the at least one region or an average weight of the pixels in the at least one region, and detecting a misalignment of the object based on at least one of: the calculated center of gravity or average weight of the pixels in the at least one region.

In another implementation, the method includes obtaining an image of the object, determining values associated with pixels in at least one region of the image, detecting a misalignment of the object based on the values, and correcting the misalignment.

In yet another implementation, the method includes obtaining an image of the object, determining values associated with pixels in at least one region of the image, detecting a position change of the object based on the values by multiplying a center of gravity deviation value of the pixels in the at least one region by a weight of the pixels in the at least one region, and correcting a misalignment of the object based on the position change.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

It is to be noted, however, that the appended drawings illustrate only typical implementations of this disclosure and are therefore not to be considered limiting of its scope, for the disclosure may admit to other equally effective implementations.

Figure 1:
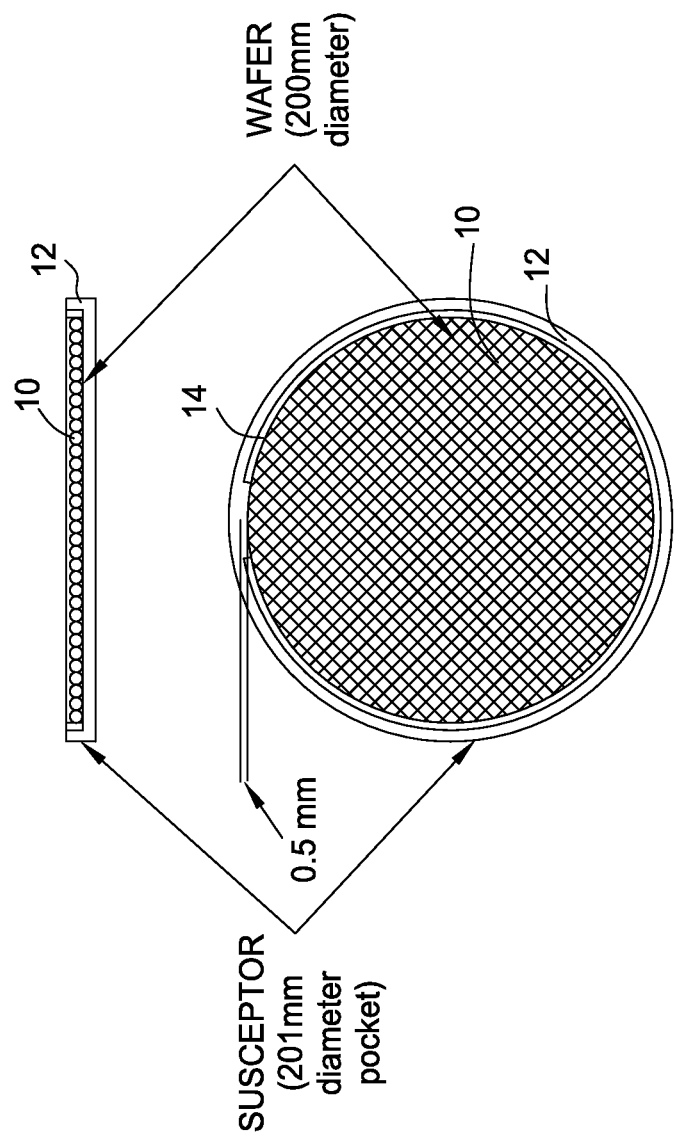
FIG. 1 (Prior Art) is a schematic diagram showing a 200 mm substrate in place in the pocket of a substrate holder of susceptor, in both top and cross sectional views, in accordance with certain aspects of the present disclosure.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations described herein generally relate to methods and apparatuses for manufacturing (e.g., fabrication) and processing semiconductor devices. Techniques and apparatus for detecting substrate misalignment (i.e., position displacement error) and/or substrate support (e.g., susceptor) misalignment, bow, and warpage are provided. Detection of misalignment may allow for the misalignment to be corrected, thereby preventing errors in the substrate manufacturing or processing process.

In one implementation, a method for detecting a misalignment of an object in a processing system is provided. The method generally includes obtaining an image of the object, determining values associated with pixels in at least one region of the image, and detecting a misalignment of the object based on the determined values.

Typically, processing systems have a centralized transfer chamber mounted on a monolith platform. The transfer chamber is the center of activity for the movement of substrates being processed in the system. One or more process chambers mount on the transfer chamber at slit valves through which substrates are passed by a substrate handler, or robot. Access to the transfer chamber from the clean ambient environment is typically through one or more load lock chambers attached at other slit valves. The load lock chambers may open to a very clean room, referred to as the white area, or to an optional substrate handling chamber, typically referred to as a mini-environment.

Figure 2:
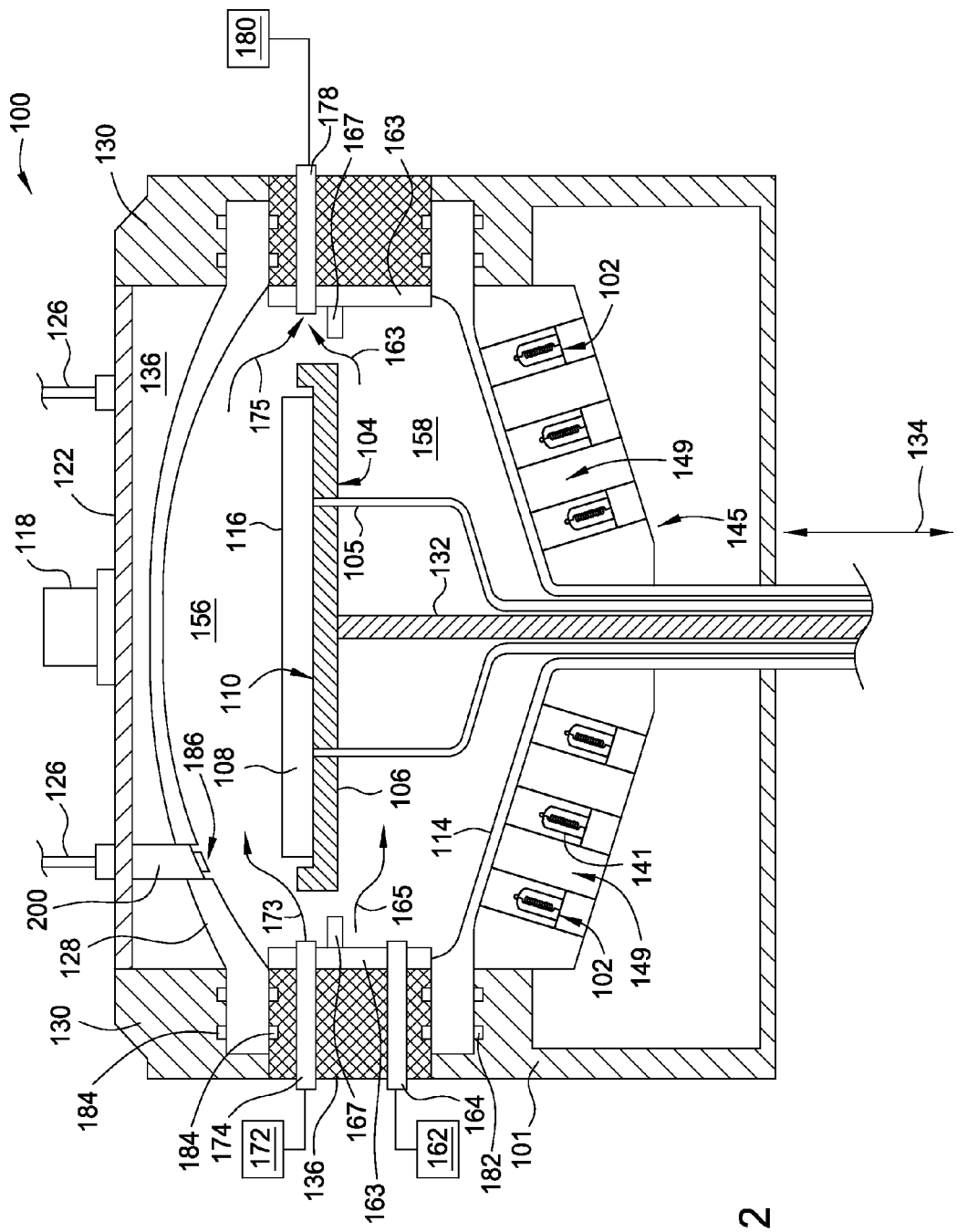
FIG. 2 is a cross section view of an illustrative processing chamber including a substrate support assembly and a positioning detection apparatus, in accordance with certain aspects of the present disclosure.

FIG. 2 shows a schematic sectional view of a backside heating process chamber 100 having a substrate support assembly and a positioning detection apparatus, in accordance with certain aspects of the present disclosure. The process chamber 100 may be used to process one or more substrates, including the deposition of a material on an upper surface of a substrate 108 (e.g., which may be similar to substrate 10). The process chamber 100 may include an array of radiant heating lamps 102 for heating, among other components, a back side 104 of a substrate support 106 (e.g., which may be a susceptor 12 shown in FIG. 1) disposed within the process chamber 100. In some implementations, the array of radiant heating lamps may be disposed over the upper dome 128. The substrate support 106 may be a disk-like substrate support 106 as shown, or may be a ring-like substrate support 107 with no central opening, which supports the substrate from the edge of the substrate to facilitate exposure of the substrate to the thermal radiation of the lamps 102.

The substrate support 106 is located within the process chamber 100 between an upper dome 128 and a lower dome 114. The upper dome 128, the lower dome 114 and a base ring 136 that is disposed between the upper dome 128 and lower dome 114 generally define an internal region of the process chamber 100. The substrate 108 (not to scale) can be brought into the process chamber 100 and positioned onto the substrate support 106 through a loading port 103.

The substrate support 106 is shown in an elevated processing position, but may be vertically traversed by an actuator (not shown) to a loading position below the processing position to allow lift pins 105 to contact the lower dome 114, passing through holes in the substrate support 106 and the central shaft 132, and raise the substrate 108 from the substrate support 106. A robot (not shown) may then enter the process chamber 100 to engage and remove the substrate 108 therefrom though the loading port 103. The substrate support 106 then may be actuated up to the processing position to place the substrate 108, with its device side 116 facing up, on a front side 110 of the substrate support 106.

The substrate support 106, while located in the processing position, divides the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

In general, the central window portion of the upper dome 128 and the bottom of the lower dome 114 are formed from an optically transparent material such as quartz. "Optically transparent" here means generally transmissive to radiation, but not necessarily 100% transmissive. As will be discussed in more detail below with respect to FIG. 2A, the thickness and the degree of curvature of the upper dome 128 may be configured in accordance with the present disclosure to provide a flatter geometry for uniform flow uniformity in the process chamber.

One or more lamps, such as an array of lamps 102, can be disposed adjacent to and beneath the lower dome 114 in a specified, optimal manner around the central shaft 132 to independently control the temperature at various regions of the substrate 108 as the process gas passes over, thereby facilitating the deposition of a material onto the upper surface of the substrate 108. While not discussed here in detail, the deposited material may include gallium arsenide, gallium nitride, or aluminum gallium nitride.

The lamps 102 may be configured to include bulbs 141 and be configured to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively and radiatively cools the lower dome 104 due in part to the close proximity of the lamphead 145 to the lower dome 104. The lamphead 145 may also cool the lamp walls and walls of the reflectors (not shown) around the lamps. Alternatively, the lower dome 104 may be cooled by a convective approach. Depending upon the application, the lampheads 145 may or may not be in contact with the lower dome 114.

A circular shield 167 may be optionally disposed around the substrate support 106 and surrounded by a liner assembly 163. The shield 167 prevents or minimizes leakage of heat/light noise from the lamps 102 to the device side 116 of the substrate 108 while providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the processing volume (i.e., the process gas region 156 and purge gas region 158) from metallic walls of the process chamber 100. The metallic walls may react with precursors and cause contamination in the processing volume. While the liner assembly 163 is shown as a single body, the liner assembly 163 may include one or more liners with different configurations.

As a result of backside heating of the substrate 108 from the substrate support 106, the use of an optical pyrometer 118 for temperature measurements/control on the substrate support can be performed. This temperature measurement by the optical pyrometer 118 may also be done on substrate device side 116 having an unknown emissivity since heating the substrate front side 110 in this manner is emissivity independent. As a result, the optical pyrometer 118 can only sense radiation from the hot substrate 108 that conducts from the substrate support 106, with minimal background radiation from the lamps 102 directly reaching the optical pyrometer 118.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 can be made of a metal such as aluminum or stainless steel. The efficiency of the reflection can be improved by coating a reflector area with a highly reflective coating such as with gold. The reflector 122 can have one or more conduits 126 connected to a cooling source (not shown). The conduit 126 connects to a passage (not shown) formed on a side of the reflector 122. The passage is configured to carry a flow of a fluid such as water and may run horizontally along the side of the reflector 122 in any pattern covering a portion or entire surface of the reflector 122 for cooling the reflector 122.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the substrate support 106 may be located in the processing position, which is adjacent to and at about the same elevation as the process gas inlet 174, allowing the process gas to flow up and round along flow path 173 across the upper surface of the substrate 108 in a laminar flow fashion. The process gas exits the process gas region 156 (along flow path 175) through a gas outlet 178 located on the side of the process chamber 100 opposite the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper dome 128 (as will be discussed in detail below), will enable a generally planar, uniform gas flow across the substrate 108. Further radial uniformity may be provided by the rotation of the substrate 108 through the substrate support 106.

As mentioned above, the substrate 108 may become misaligned (e.g., due to degradation or other factors) on the substrate support 106 and/or the substrate support 106 may become misaligned and may not rotate evenly, be titled, or off-center. Such misalignments may result in the substrate 108 being processed non-uniformly. In order to detect such misalignments, a position detection apparatus, e.g., camera 200 may be employed in the processing chamber 100.

As shown in FIG. 2, the process chamber 100 may include a camera 200. The camera 200 may be positioned above the top of the process chamber 100, and a collection device, for example a light pipe, for the camera may be disposed through the top of the process chamber 100 into the process gas region 156. Alternately, the camera 200 may be positioned inside the process chamber 100. For example, the camera 200 may be disposed in an opening 186 in the upper dome 128 between the upper dome 128 and the reflector 122. The camera 200, or a collection device for the camera, may be disposed through a portal for connecting the conduit 126 to the process chamber 100, or alternatively, the camera 200 may be coupled to the chamber using a chassis. The camera 200 may be capable of operating in a vacuum or at atmospheric pressure. The camera 200 may be in the process chamber 100 to take an image of the substrate 108, an edge ring, a mask, and/or the substrate support 106. The position of the camera 200 relative to the upper dome 128 and the substrate support 106, and the optical characteristics of the camera 200 may be determined to ensure a field of view that includes an edge of the substrate 108, edge ring, mask, and/or or substrate support 106 for use in the position detection.

The camera 200 can be electrically connected to a controller (not shown) that controls operations (e.g., on/off, focusing, image-taking, and the like) of the camera 200. The controller may download a program stored in a storage medium through an input/output (I/O) device (not shown), and carry out a position detection method described below by controlling the camera 200 in accordance with the program.

When detecting a position of the substrate 108, edge ring, mask, and/or or substrate support 106, the substrate 108, edge ring, mask, and/or or substrate support 106 will be heated by the heat lamps 102.

It should be noted that the camera 200 is only one example of an apparatus that can be used for imaging and that any other types of imaging apparatus can be used as a positioning detection apparatus. In some implementations, more than one camera can be used to capture images of the substrate 108, edge ring, mask, and/or substrate support 106. In some implementations, the camera 200 is an image capturing device may be a high efficiency, low voltage complementary metal oxide semiconductor (CMOS) sensor, which functions as a single chip video camera. The CMOS sensor may be of the VGA type. The camera 200 may include a lens, such as a wide angle lens or a plano-convex type lens having an appropriate focal length to provide sufficient visual clarity within the predetermined range of operation of the camera 200. It will be apparent to those skilled in the art that different lenses (e.g., telescoping or rotational prism lenses) may be used for different applications. It will also be appreciated that other types of cameras or optical sensors may be employed, including, but not limited to cameras of the SVGA, XGA, MEGA pixel type, or other image capturing devices. If necessary, multiple image capturing devices of differing types of resolution can be employed in conjunction with lenses of varying types and focal lengths. The camera or sensor could be of a static (still) or dynamic (video) type, and could be of the charged coupled device (CCD) type. In addition, the camera could be used to output a video signal to any standard TV format.

The camera 200 may output images of the substrate 108, edge ring, mask, and/or or substrate support 106, or any other region of interest within a field of view of the camera 200. In processing black and white images (i.e. "monochromatic images"), systems treat image data as an array of discrete gray level pixels ("picture elements"). Each pixel is associated with a position in the image and an 8-bit digital value that encodes an intensity value in the range from 0 to 255. Each intensity value represents a gray level of the monochromatic image, ranging from absolute black (0) to absolute white (255). Alternately, the image data can be represented as a 12-bit digital value, comprising 4096 possible intensity values, ranging from 0 (black) to 4095 (white). In color images, the color data for the image may also be encoded in intensity values for the pixels. However with color images, each pixel is encoded by three intensity values, ranging from 0 to 255, or from 0 to 4095, which combine to define an output color for the pixel. In one color intensity system, the three values represent the intensity of red, green, and blue (RGB) color in the pixel.

Techniques and apparatus are provided herein for detecting substrate misalignment (i.e., position displacement error) and/or substrate support (e.g., susceptor) misalignment, for example, by imaging regions of interest on a substrate 108, edge ring, mask, and/or or substrate support 106, calculating values related to pixels in the images, and calculating x-y coordinates of the imaged region "weight" and/or "center of gravity" using the values, in order to determine positions and misalignments. Detection of misalignment may allow for the misalignment to be corrected, thereby preventing errors in the substrate manufacturing or processing process.

Example System and Method to Detect Substrate and/or Substrate Support Misalignment Using Imaging As described above, optical systems (e.g., such as camera 200 shown in FIG. 2), either inside a semiconductor processing/manufacturing chamber (e.g., such as heating process chamber 100) or outside the chamber but with a view through an aperture in the chamber, can be used to image regions of interest of objects within the chamber, such as a substrate (e.g., such as substrate 10 or 108), a mask, an edge ring, and/or a susceptor (e.g., such as susceptor 12 or substrate support 106). The regions of interest may include edges or interior surfaces of the objects in the chamber. For example, in some implementations, a first imaged region may include the edge of substrate support 106 to show position of the substrate support 106, a second imaged region may include the substrate 108 edge to show substrate 108 position, and a third imaged region may include a high contrast area of the substrate 108 to show substrate warpage. In some implementations, different numbers of regions may be imaged at different locations. In some implementations, the shape of the imaged regions may vary. For example, an imaged region may be rectangular, circular, or other shape.

As mentioned above, the camera 200 outputs images of the regions of interest and image data is treated as an array of pixels. Each pixel is associated with a position in the image and one or more digital values that encode an intensity value. During digital image processing each pixel can be represented in the computer memory or interface hardware (for example, a graphics card) as binary values for the red, green, and blue color components. When properly managed, these values are converted into intensities or voltages via gamma correction to correct the inherent nonlinearity of some devices, such that the intended intensities are reproduced on the display.

According to certain aspects, the values correspond to RGB (red-green-blue) values. Charge-coupled devices (CCDs) that use CMOS or CCD image sensors often operate with some variation of the RGB model. For example, the sensor may have a grid of red, green, and blue detectors arranged so that the first row is RGRGRGRG, the next is GBGBGBGB, and that sequence is repeated in subsequent rows.

According to certain aspects, an image deviation value may be calculated from the pixel values of the pixels in the imaged regions of interest. For example, a "center of gravity" of the imaged regions may be calculated to provide an x- and/or y-coordinate of the center of gravity. The "center of gravity" in one aspect may represent a coordinate location in the imaged region. The x-location of the "center of gravity" may be determined by multiplying the intensity value of each pixel by its x coordinate, summing the resulting values, and dividing by the sum of the intensity values. To wit, $$C_x = \frac{\sum x_i p_i}{\sum p_i},$$

where $C_x$ is the x coordinate of the "center of gravity", $x_i$ is the x coordinate of the ith pixel, and $p_i$ is the intensity value (gray scale, red, green, blue, etc.) of the ith pixel. For example, the values of the pixels in a region may be added as a weighted sum and then divided by the number of pixels to provide the center of gravity. Alternatively, a scalar "weight" of the imaged region may be calculated by summing and then taking an average of the pixel values in the imaged region.

An image deviation value may be determined from the "center of gravity" as the change in any value of the "center of gravity", either the x coordinate, the y coordinate, or the scalar value of the "center of gravity" for any or all intensity values. An image deviation value may also be determined as the delta between any value of the "center of gravity" and a constant. The "center of gravity" values may be resolved as a time-series of data, which may be subjected to any time-series analysis to determine image deviation values. For example, statistical procedures such as moving averages, root-mean-square deviations, standard deviations, and the like may be used to determine image deviation values.

According to certain aspects, by monitoring (e.g., during rotation of the substrate support 106) the values of pixels in the imaged regions and determining image region center of gravity values and/or image region weights, misalignments may be detected. For example, if the center of gravity of the imaged region shifts or is off center, a misalignment may be detected. Similarly, if the image region weight shifts, misalignment may be detected.

According to certain aspects, detected misalignment values may be outputted to a user in order to allow the misalignment to be corrected. Additionally or alternatively, the misalignment values may be stored in a memory connected to the optical imaging apparatus. If output on a screen, monitor, printout, or the like, the value of center of gravity and weight may be output as a signal and monitored for oscillations which may indicate misalignment.

According to certain aspects, during rotation, detected misalignment values may be associated with rotation speeds.

Figure 3:
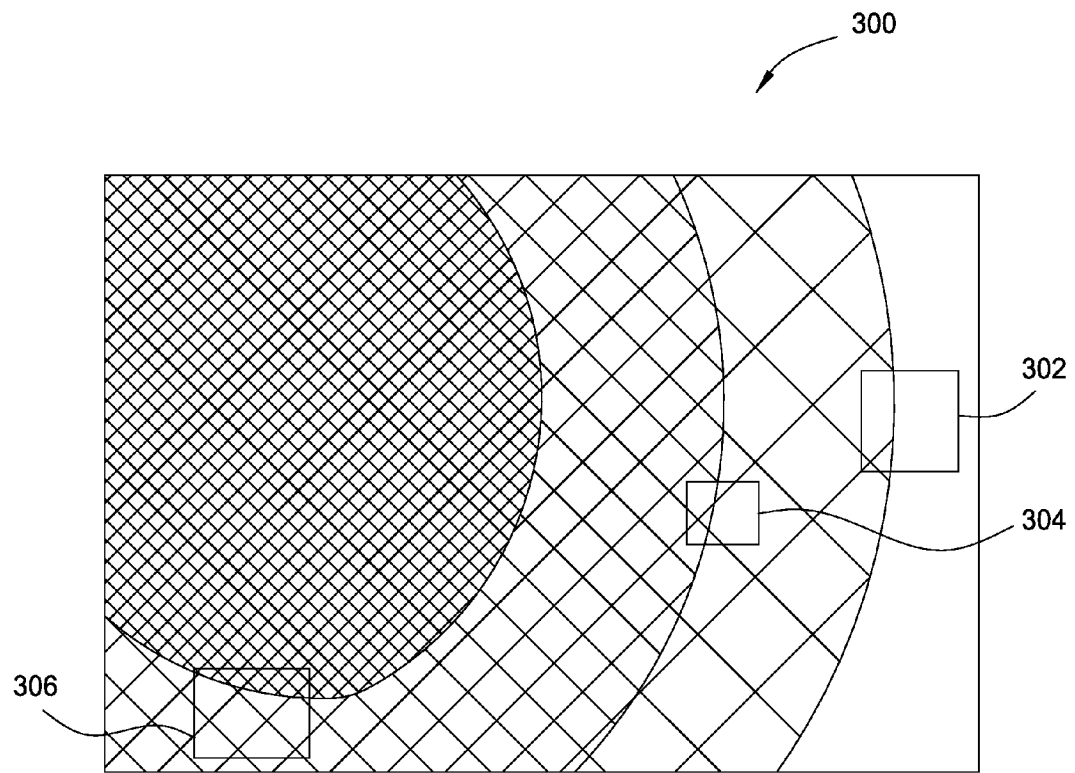
FIG. 3 is an example field of view of a camera with three regions of interest to be imaged, in accordance with certain aspects of the present disclosure.

FIG. 3 is an example image from a camera disposed to capture images from a processing chamber, with three regions of interest identified on the image, in accordance with certain aspects of the present disclosure. As shown in FIG. 3, a first region 302 may be selected at or near the edge of the substrate support 106 to detect susceptor misalignment. A second region 304 may be selected at or near the edge of the substrate 108 to detect substrate misalignment. And a third region 306 may be selected in an area on the substrate 108 to detect warpage of the substrate 108.

Figure 4:
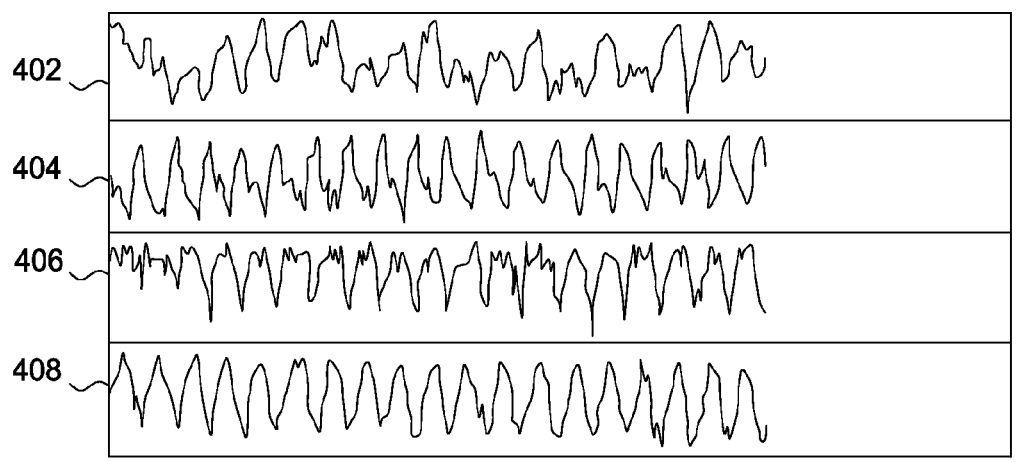
FIG. 4 is an example of output of center of gravity calculations and weight calculations corresponding to raw and filtered images of the first region of FIG. 4, in accordance with certain aspects of the present disclosure.

FIG. 4 is an example of center of gravity and weight time-series data corresponding to raw and filtered images of the first region 302 of FIG. 3. As shown in FIG. 4, a first output signal 402 shows x-coordinate values corresponding a calculated center of gravity of pixels in a raw image of the first region 302. A second output signal 404 shows x-coordinate values corresponding to a calculated center of gravity of pixels in a filtered image of the first region 302. A third output signal 406 shows a calculated weight of pixels in a raw image of the first region 302. A fourth output signal 408 shows a calculated weight of pixels in a filtered image of the first region 302.

Figure 5:
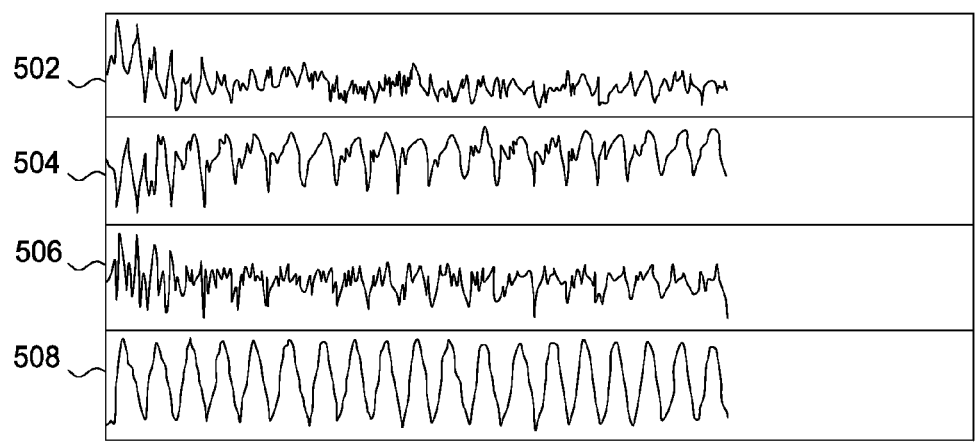
FIG. 5 is an example of output of center of gravity calculations and weight calculations corresponding to raw and filtered images of the second region of FIG. 4, in accordance with certain aspects of the present disclosure.

FIG. 5 is an example of output of center of gravity calculations and weight calculations corresponding to raw and filtered images of the second region 304 of FIG. 3, in accordance with certain aspects of the present disclosure. As shown in FIG. 5, a first output signal 502 shows x-coordinate values corresponding a calculated center of gravity of pixels in a raw image of the second region 304. A second output signal 504 shows x-coordinate values corresponding to a calculated center of gravity of pixels in a filtered image of the second region 304. A third output signal 506 shows a calculated weight of pixels in a raw image of the second region 304. A fourth output signal 508 shows a calculated weight of pixels in a filtered image of the second region 304.

Figure 6:
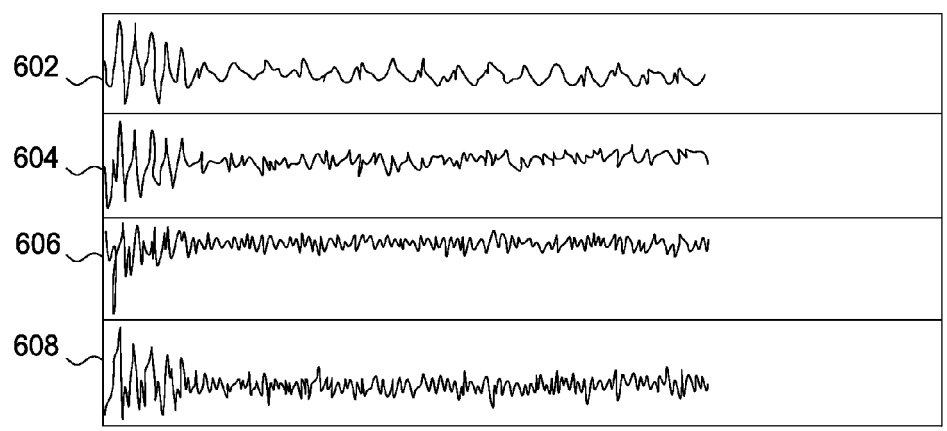
FIG. 6 is an example of output of center of gravity calculations and weight calculations corresponding to raw and filtered images of the third region of FIG. 4, in accordance with certain aspects of the present disclosure.

FIG. 6 is an example of output of center of gravity calculations and weight calculations corresponding to raw and filtered images of the third region 306 of FIG. 3, in accordance with certain aspects of the present disclosure. As shown in FIG. 6, a first output signal 602 shows x-coordinate values corresponding a calculated center of gravity of pixels in a raw image of the third region 306. A second output signal 604 shows x-coordinate values corresponding to a calculated center of gravity of pixels in a filtered image of the third region 306. A third output signal 606 shows a calculated weight of pixels in a raw image of the third region 306. A fourth output signal 608 shows a calculated weight of pixels in a filtered image of the third region 306.

Figure 7:
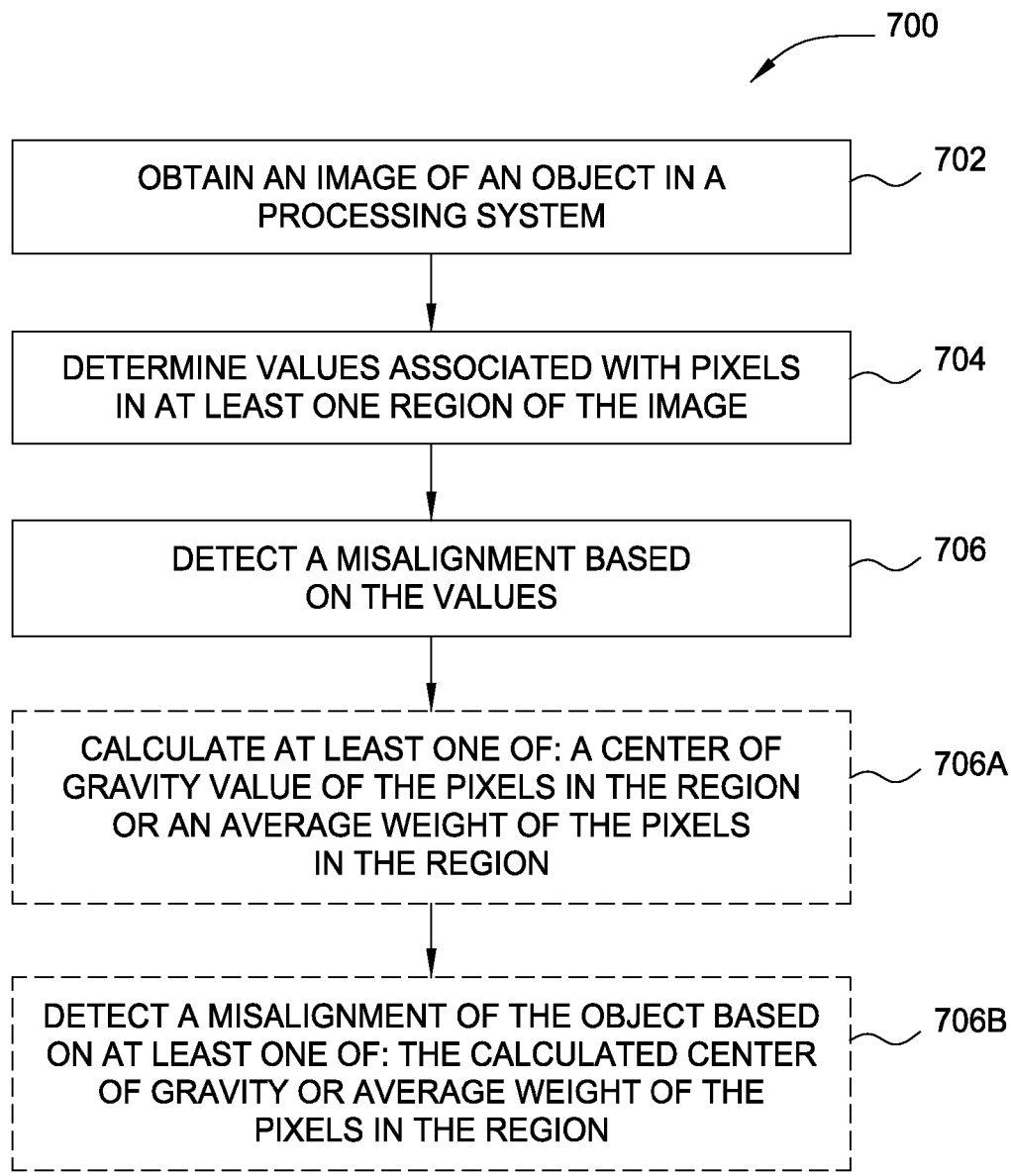
FIG. 7 is a flow diagram illustrating example operations for detecting misalignment of a substrate or substrate support, in accordance with certain aspects of the present disclosure.

FIG. 7 is a flow diagram illustrating example operations 700 for detecting misalignment of an object in a processing system, in accordance with certain aspects of the present disclosure. At 702, an image of the object may be obtained. The object may be a substrate, a mask, an edge, susceptor, or the like. The image may be obtained using a video camera (e.g., CMOS, SVGA, XGTA, or MEGA pixel type). According to certain aspects, the image may be obtained while the object is rotating.

At 704, values associated with pixels (e.g., RGB values) in at least one region of the image may be determined. The values may be from either the raw image or a filtered image.

At 706, a misalignment of the object may be detected based on the values. According to certain aspects, the detection of the misalignment of the object may include blocks 706A and 706B. For example, at 706A, at least one of: a center of gravity value of the pixels in the region or an average weight of the pixels in the region may be calculated and, at 706B, a misalignment of the object may be detected based on at least one of: the calculated center of gravity or average weight of the pixels in the region. According to certain aspects, the operations 700 may further include obtaining a second image of the object subsequent to obtaining the first image (e.g., at a later time). Values associated with pixels in the at least one region of the second image may be determined and compared to the determined values associated with the pixels in the at least one region of the first image. Detection of the misalignment of the object may further based on the comparison (e.g., by observing how the center of gravity value and/or the average weight of the pixels in the at least one region change from the first image to the second image).

According to certain aspects, values of pixels in multiple regions of an image may be determined (e.g., at least a first region and a second region). A first phase of the determined values associated with pixels in the first region and a second phase of the determined values associated with pixels in the second region may be determined and compared. Detection of the misalignment of the object may then also be based on the comparison of the phases.

Misalignment of the substrate or substrate support, or warping of the substrate, generally has the effect that image values cycle when the substrate is rotated. Characteristics of the cycling indicate misalignment above a predetermined tolerance, and may indicate the type of misalignment. An amplitude of the cycle may be determined and compared to a standard to identify misalignment that is beyond a tolerance. A phase of the cycle may be determined and compared between regions to identify the type of fault. For example, cycling in a region that includes an edge of the substrate support and a region including an edge of the substrate may be compared to determine whether only the substrate support is misaligned (both region cycling with equal phase and amplitude above tolerance), only the substrate is misaligned (only substrate edge region is cycling above tolerance), or both are misaligned (both regions cycling above tolerance with unequal phase). Similar comparisons may be used to determine whether cycling in the region imaged to determine warping of the substrate is due to substrate or substrate support misalignment, rather than substrate warping. If cycling in a substrate edge region and a substrate warping region have equal amplitude, misalignment of the substrate may be indicated. Phase angle between substrate edge region cycling and substrate warping region cycling may indicate relative azimuthal location of substrate warping and substrate misalignment.

According to certain aspects, once the weight of a region has been calculated using the techniques described above and multiple center of gravity values for the region have been determined over time, a center of gravity deviation value may be determined by calculating a difference between the center of gravity values. According to certain aspects, the center of gravity deviation value for the region may be multiplied by the weight of the region to obtain a more accurate value representing position change. For example, the image may be divided by rectangles and rectangle with the maximum center of gravity deviation may be selected. Particularly, rectangle with black part of the image, instead of the rectangle with "real" changes, is selected. If the area of the image that is used to check "deviation" is black with "practically black" spots at random location (contrast resolution error) and "standard" color-weight assignment is used, then just "center of gravity" deviation can be relatively big and random. Therefore, if the calculation is done by multiplying the center of gravity deviation by weight of a region, then new value will be better represent real image or position change.

According to certain aspects, the techniques described herein may also be applied to determine energy, power, impulse, and momentum values of the image change.

In sum, implementations of the disclosure techniques and apparatus for detecting substrate misalignment (i.e., position displacement error) and/or substrate support (e.g., susceptor) misalignment, substrate bow and/or warpage, for example, by imaging regions of interest on a substrate 108, edge ring, mask, and/or or substrate support 106, calculating values related to pixels in the images, and calculating x-y coordinates of the imaged region "weight" and/or "center of gravity" using the values, in order to determine positions, misalignments, bow, and/or warpage. Detection of misalignment may allow for the misalignment to be corrected, thereby preventing errors in the substrate manufacturing or processing process.

While the foregoing is directed to implementations of the present disclosure, other and further implementations of the disclosure may be devised without departing from the basic scope thereof, and the scope thereof is determined by the claims that follow.

What is claimed is:

1. A method for detecting a misalignment of an object in a processing system, comprising:
   obtaining a first image of a semiconductor processing object;
   obtaining a second image of the semiconductor processing object subsequent to obtaining the first image;
   determining first values associated with pixels in at least one region of the first image;
   determining second values associated with pixels in a least one region of the second image;
   calculating at least one of:
      a center of gravity value of the pixels in the at least one region of the first image; and
      an average weight of the pixels in the at least one region of the first image;
   detecting a misalignment of the semiconductor processing object based on at least one of:
      the calculated center of gravity; and
      the calculated average weight of the pixels in the at least one region of the first image; and
   comparing the second values associated with pixels in the at least one region of the second image to the first values associated with pixels in the at least one region of the first image, wherein the detecting a misalignment of the semiconductor processing object is further based on the comparison of the second values and the first values in the at least one region between the first image and the second image.

2. The method of claim 1, wherein the semiconductor processing object comprises a substrate, a mask, an edge, or a substrate support.

3. The method of claim 1, wherein the determining first values associated with pixels comprises determining an RGB value associated with each pixel.

4. The method of claim 1, wherein the first image is obtained using a video camera comprising at least one of: a CMOS, SVGA, XGTA, or MEGA pixel type sensor.

5. The method of claim 1, wherein the first image is obtained while the object is rotating.

6. The method of claim 1, wherein the at least one region of the first and second images comprises:
   at least a first region and a second region.

7. The method of claim 6, wherein the determining second values associated with pixels in the at least one region of the second image comprises:
determining values associated with pixels in the first region and pixels in the second region.

8. The method of claim 7, further comprising:
determining a first phase of the values associated with pixels in the first region; and
determining a second phase of the values associated with pixels in the second region.

9. The method of claim 8, further comprising:
comparing the first phase with the second phase, and wherein
detecting a misalignment of the semiconductor processing object is further based on the comparison of the first phase and the second phase.

10. A method for correcting a misalignment of an object in a processing system, comprising:
obtaining an image of a semiconductor processing object, wherein the image is obtained while the semiconductor processing object is rotating;
determining values associated with pixels in at least one region of the image;
detecting a misalignment of the semiconductor processing object based on the determined values, comprising:
calculating at least one of:
a center of gravity value of the pixels in the at least one region; or
an average weight of the pixels in the at least one region; and
detecting a misalignment of the semiconductor processing object based on at least one of:
the calculated center of gravity; or
the calculated average weight of the pixels in the at least one region; and
comparing the determined values; and
correcting the misalignment.

11. The method of claim 10, wherein the semiconductor processing object comprises a substrate, a mask, an edge, or a substrate support.

12. The method of claim 10, wherein the determining values associated with pixels comprises determining an RBG value associated with each pixel.

13. The method of claim 10, wherein the image is obtained using a video camera comprising at least one of: a CMOS, SVGA, XGTA, or MEGA pixel type sensor.

14. The method of claim 10, wherein the image comprises a raw image.

15. The method of claim 10, wherein the image comprises a filtered image.

16. A method for correcting a misalignment of an object in a processing system, comprising:
obtaining an image of a semiconductor processing object, wherein the image is obtained while the semiconductor processing object is rotating;
determining values associated with pixels in at least one region of the image;
detecting a position change of the semiconductor processing object based on the values by multiplying a center of gravity deviation value of the pixels in the at least one region by a weight of the pixels in the at least one region and comparing the determined values; and
correcting a misalignment of the semiconductor processing object based on the position change.

* * * * *